(12) United States Patent
Lin

(10) Patent No.: US 11,191,183 B1
(45) Date of Patent: Nov. 30, 2021

(54) SERVER FAN WITH AIRFLOW SHIELDING STRUCTURE

(71) Applicant: Super Micro Computer Inc., San Jose, CA (US)

(72) Inventor: Ken-Sheng Lin, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 16/883,836

(22) Filed: May 26, 2020

(51) Int. Cl.
*H05K 7/20* (2006.01)

(52) U.S. Cl.
CPC ..... *H05K 7/20172* (2013.01); *H05K 7/20736* (2013.01)

(58) Field of Classification Search
CPC .............................. H05K 7/20172; G06F 1/20
See application file for complete search history.

(56) References Cited

U.S. PATENT DOCUMENTS

| | | | |
|---|---|---|---|
| 8,475,119 B2* | 7/2013 | Li | G06F 1/20 415/147 |
| 2008/0273305 A1* | 11/2008 | Lee | H05K 7/20172 361/695 |
| 2014/0211419 A1* | 7/2014 | Liao | H05K 7/20181 361/695 |

* cited by examiner

*Primary Examiner* — Mukundbhai G Patel
(74) *Attorney, Agent, or Firm* — Chun-Ming Shih; HDLS IPR Services

(57) ABSTRACT

A fan module includes a fan body and metal plates. The fan body has a fan seat, and the fan seat is provided with coupling holes. The metal plates enclose the fan body and expose an outlet side. The position assembly includes a position frame and position members. The position frame has an air outlet and is fixed on the outlet side. The airflow shielding structure includes shutter plates and a connection rod. One side of the shutter plates are pivoted at the position frame, and the shuttle plates are capable of turning simultaneously for opening and closing the air outlet so as to maintain the normal operation of the server fan.

16 Claims, 9 Drawing Sheets

SERVER FAN WITH AIRFLOW SHIELDING STRUCTURE

BACKGROUND OF THE INVENTION

Field of the Invention

The present invention generally relates to a server system, and more particular, to a server fan with airflow shielding structure.

Description of Prior Art

Currently, most of chassis of server systems are assembled with electronic devices such as motherboards, data processing units and power supplies. Moreover, multiple fan modules are usually provided inside the chassis to dissipate heat from data processing units quickly and effectively. At that time, the pressure inside the chassis forms a positive pressure under the airflow generated by the fan modules.

Furthermore, when one of the fan modules of the server system is out of order during operation, the failure fan module is removed from the chassis by users, and then another good fan module is placed into the chassis for replacement. However, the good fan module might be reversed due to the airflow of positive pressure inside the chassis under the condition while not start running. Then, after the good fan module is electrically connected, its motor needs to overcome the reverse impedance before running. Thus, the motor might have a breakdown under high load frequently, so it needs to be improved.

In view of the above drawbacks, the Inventor proposes the present invention based on his expert knowledge and elaborate research in order to solve the problems of prior art.

SUMMARY OF THE INVENTION

Accordingly, an object of the present invention is to provide a server fan with airflow shielding structure to prevent the server fan from being affected by the airflow in the server chassis, so as to maintain a normal operation of the server fan.

In order to achieve the object mentioned above, the present invention provides a server fan with airflow shielding structure for combining in a server chassis comprising a fan module, a position assembly, and an airflow shielding structure. The fan module includes a fan body and a plurality of metal plates. The fan body has a fan seat, and the fan seat is provided with a plurality of coupling holes. The metal plates enclose the fan body and expose an outlet side. The position assembly includes a position frame and a plurality of position members. The position frame has an air outlet and is fixed on the outlet side through the position members inserting the coupling holes. The airflow shielding structure includes a plurality of shutter plates and a connection rod connected to the shielding plates. One side of the shutter plates are pivoted at the position frame, and the shuttle plates are capable of turning simultaneously for opening and closing the air outlet through the connection rod.

Comparing to the prior art, the server fan of the present invention has shielding structure, wherein the shutter plates are capable of shutting at the air outlet. Moreover, when the server fan needs to be replaced, the shutter plates are shut to prevent the server fan from reversing by the airflow inside the server chassis before running. Furthermore, when the server fan starts to generate a force airflow, the shutter plates are turned by the force airflow to open simultaneously through the connection rod. Thereby, the server fan can be prevented from being affected by the airflow in the chassis of server for maintaining a normal operation of the server fan. Therefore, the practicality of the present invention is enhanced.

BRIEF DESCRIPTION OF DRAWINGS

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, not being used to limit its executing scope. Any equivalent variation or modification made according to appended claims is all covered by the claims claimed by the present invention.

Figure 1:
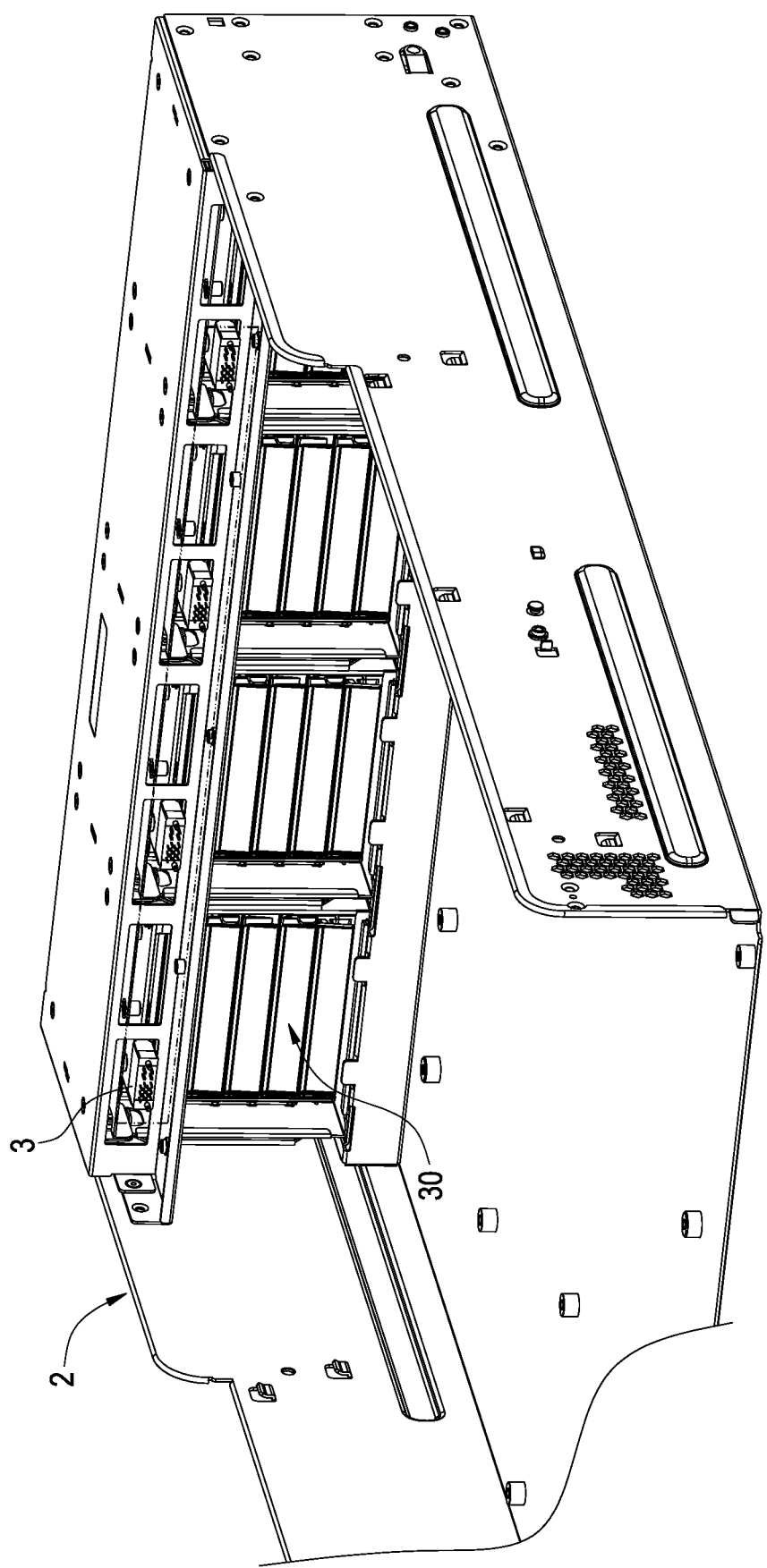
FIG. 1 and FIG. 2 are perspective schematic views from two sides of multiple server fans combined in the server chassis of the present invention.
Figure 2:
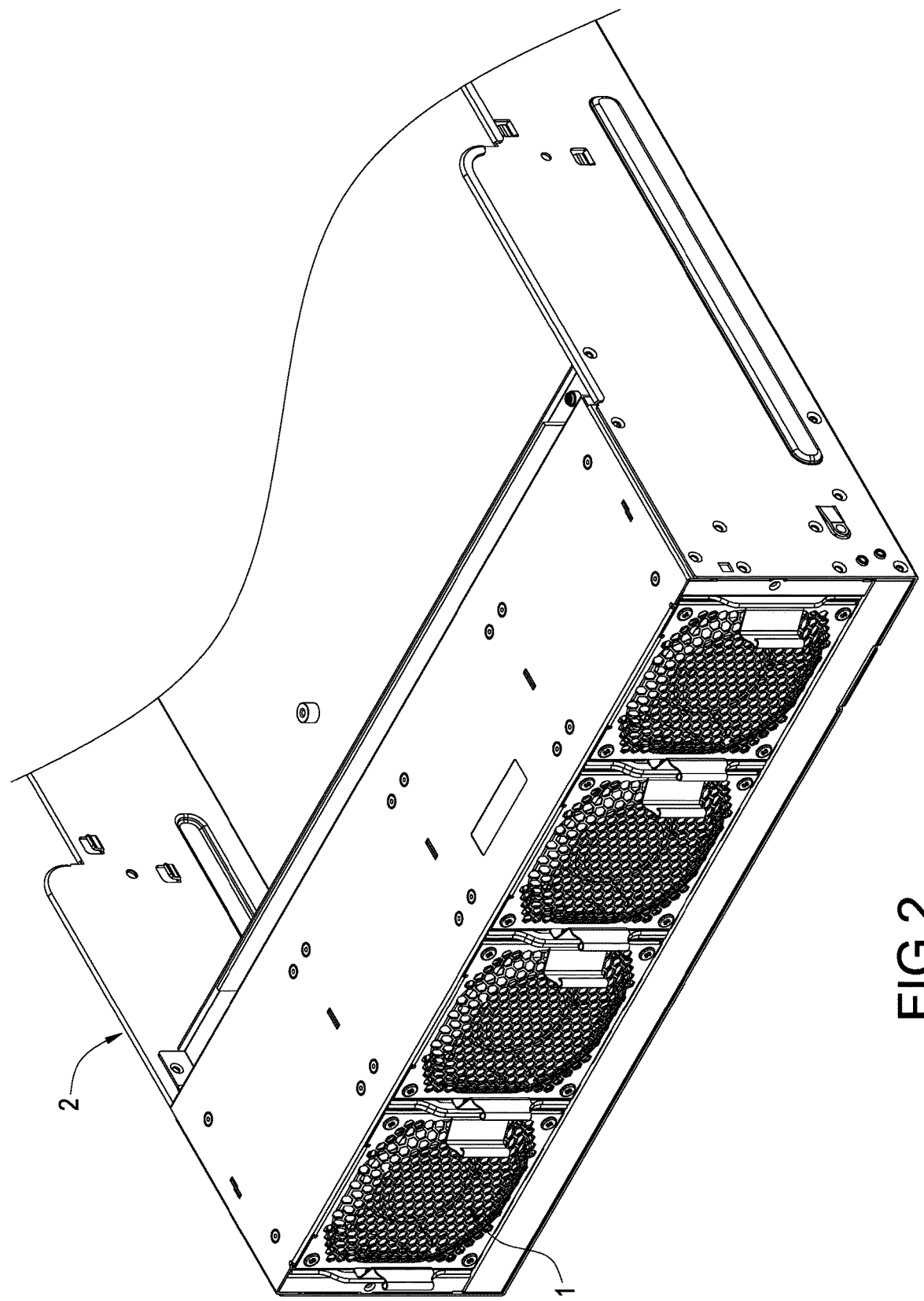
Figure 3:
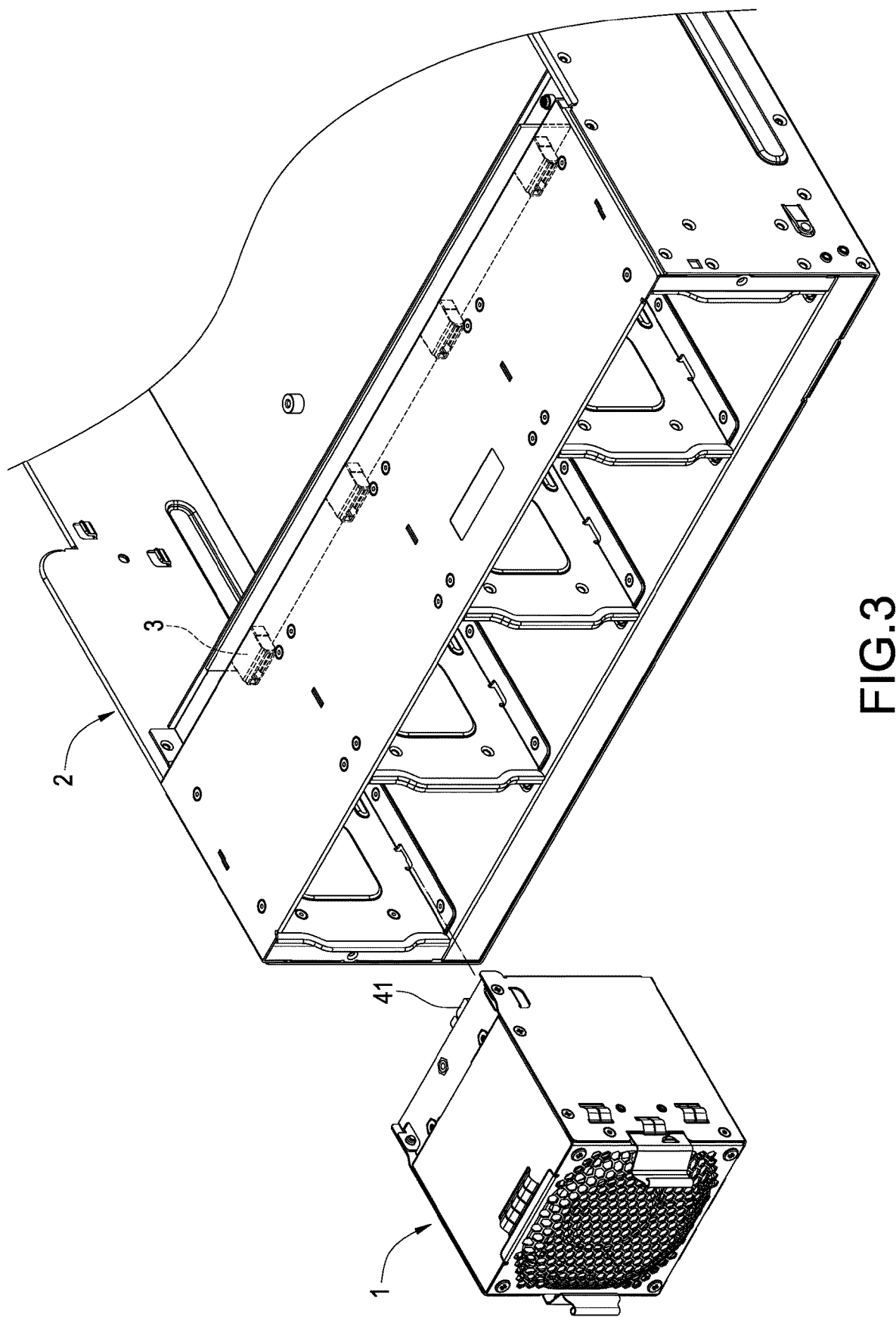
FIG. 3 is a perspective schematic view of a single server fan separated from the server chassis of the present invention.

Please refer to FIG. 1 to FIG. 3, which depict perspective schematic views from two sides of multiple server fans combined in the server chassis of the present invention and a perspective schematic view of a single server fan separated from the server chassis of the present invention. The present invention is a server fan 1 with airflow shielding structure for combining in a server chassis 2. In the present embodiment, a plurality of server fans 1 are provided inside the server chassis 2, and the server fans 1 are combined in a side of the server chassis 2. In addition, the server chassis 2 is provided with a connector 3 corresponding the location of each server fan 1, and the connector 3 is electrically connected a power supply (not shown). When the server fan 1 inserts in server chassis 2, the server fan 1 is connected with the corresponding connector 3 to provide the required power of each server fan 1 during operation. The server fan 1 is described in more detail as follows.

Figure 4:
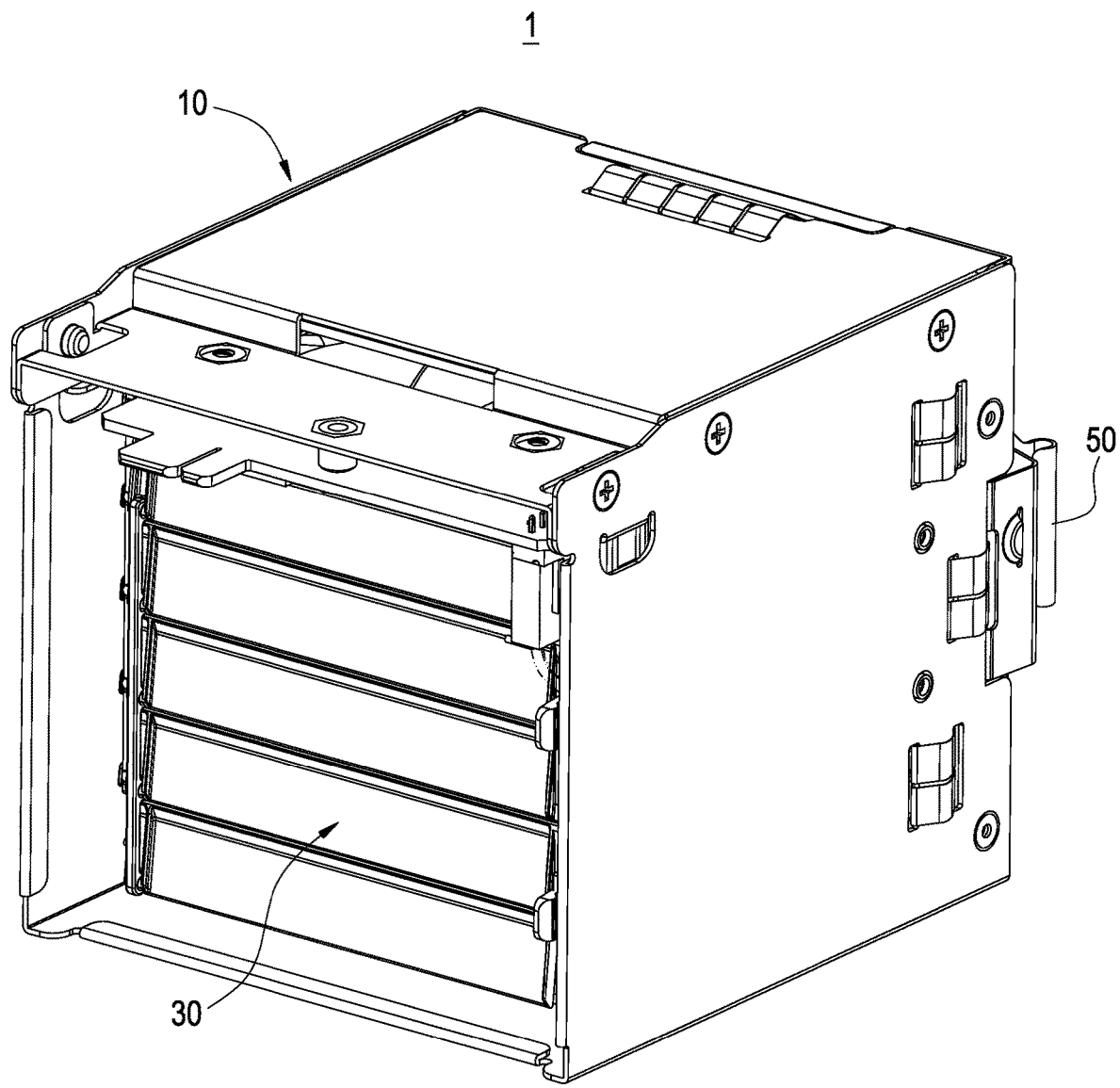
FIG. 4 and FIG. 5 are perspective schematic views from two sides of the server fan of the present invention.
Figure 5:
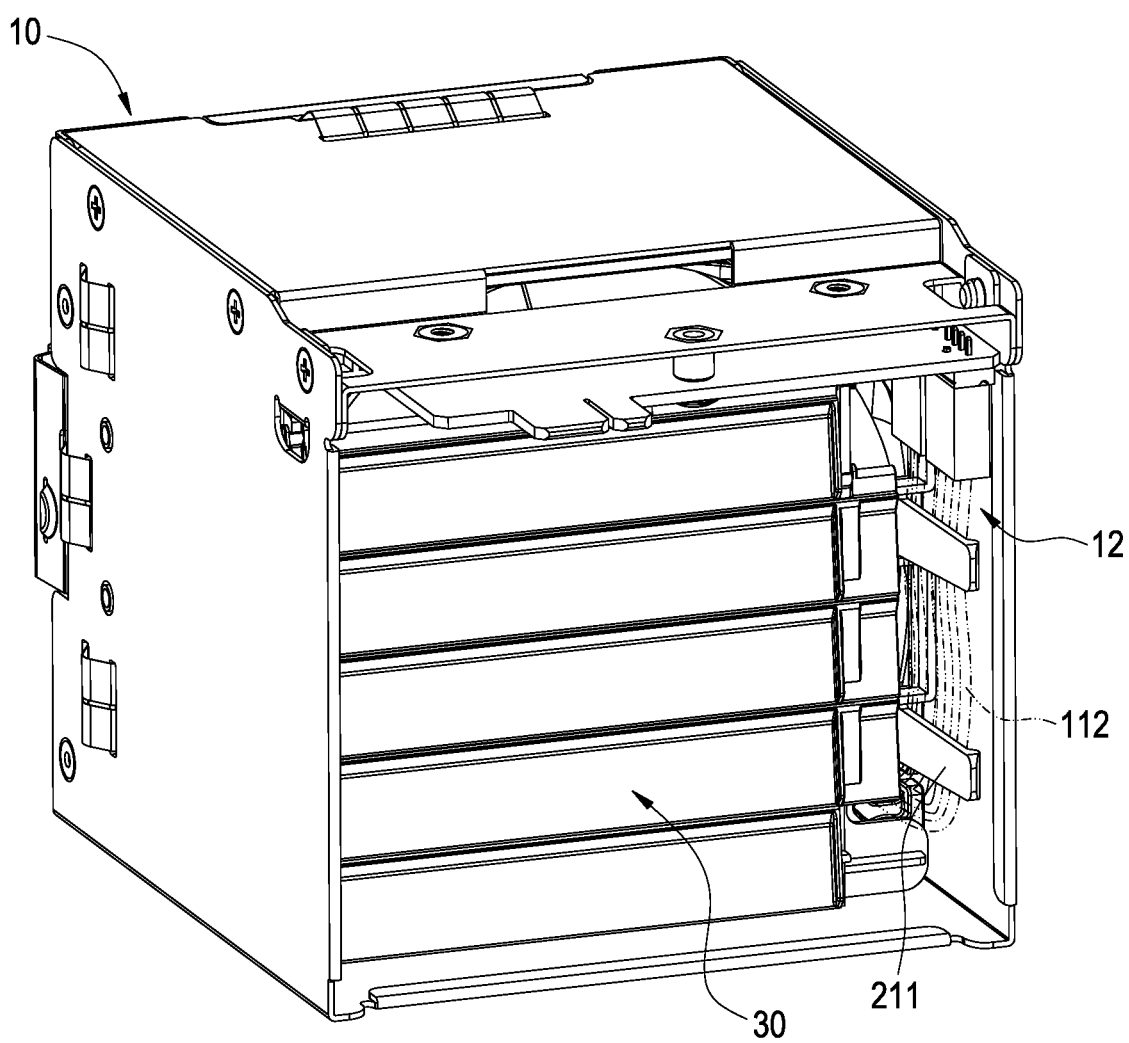
Figure 6:
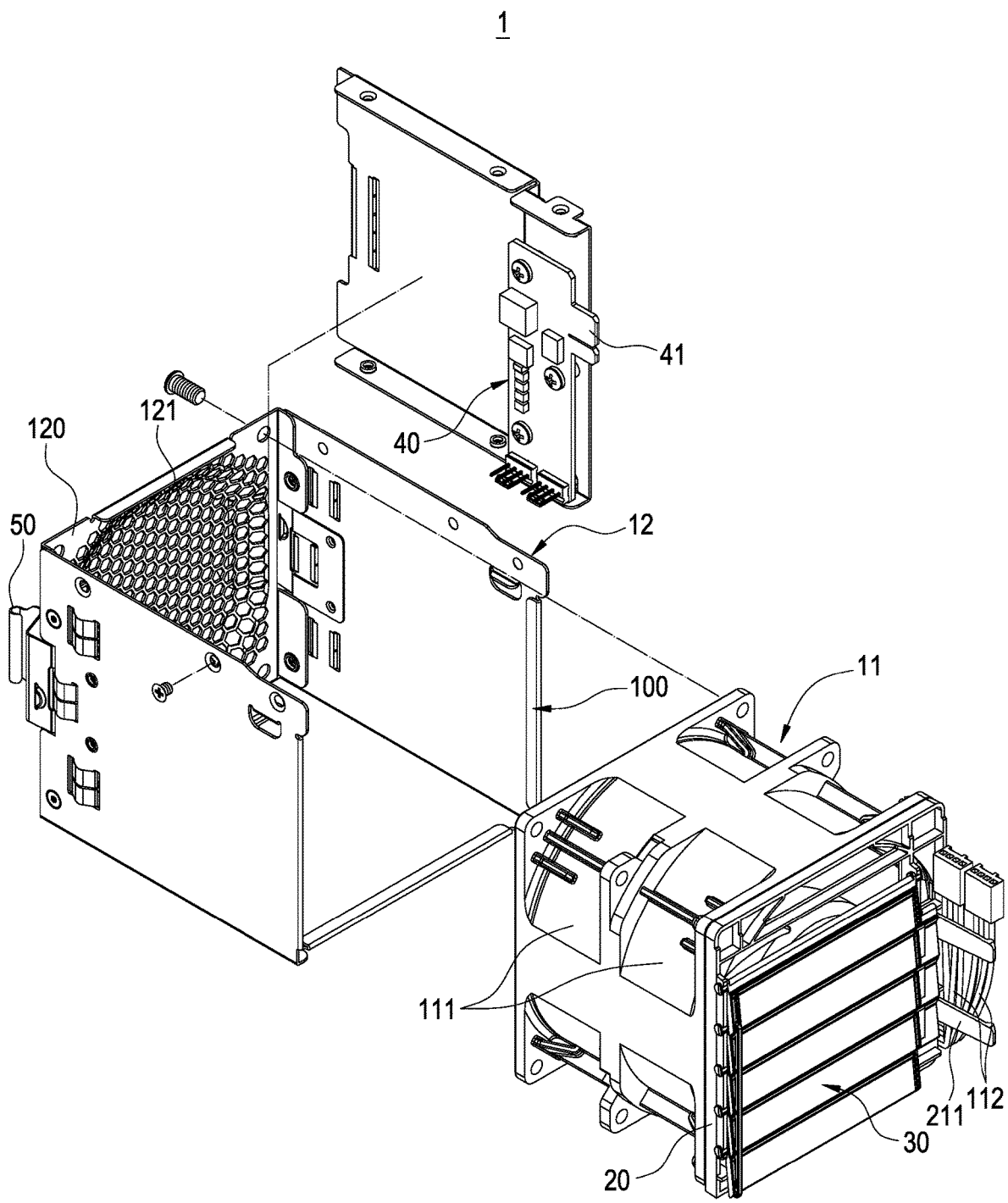
FIG. 6 is an explosion view of the fan module of the present invention.

Please further refer to FIG. 4 to FIG. 6, which depict perspective schematic views form two sides of the server fan of the present invention and an explosion view of the fan module of the present invention. The server fan 1 of the present invention includes a fan module 10, a position assembly 20, and an airflow shielding structure 30. The position assembly 20 is combined with the fan module 10 at a side facing the interior of the server chassis 2. Additionally, the airflow shielding structure 30 is coupled to the position assembly 20 so as to open or close the outlet side of the fan module 10.

The fan module 10 includes a fan body 11 and a plurality of metal plates 12. In the present embodiment, the fan body 11 includes two fans 111 connected in series and two fan cables 112, and the two fan cables 112 are connected to the two fans 111 separately. Furthermore, the metal plates 12 enclose the fan body 11 and expose an outlet side 100. The disposition of the metal plates 12 are provided for preventing the electromagnetic interference (EMI) of the fans 111.

Moreover, the server fan 1 further includes a circuit module 40. The circuit module 40 is disposed on one of the metal plates 12 and connected with the two fan cables 112. The metal plates 12 include a rear plate 121 located at an opposite side of the outlet side 100, and the rear plate 121 is provided with a plurality of air holes 120 configured in a honeycomb shape separately.

It is worthy of notice that the circuit module 40 has a connection port 41, and the connection port 41 is inserted with the connector 3 (refer to FIG. 3) when the server fan 1 inserts the server chassis 2. Additionally, in the present invention, the server fan 1 further includes a pair of clamp pieces 50, and the pair of clamp pieces 50 are coupled to two outer sides of the rear plate 121 correspondingly for users to hold and extract the server fan 1.

Figure 7:
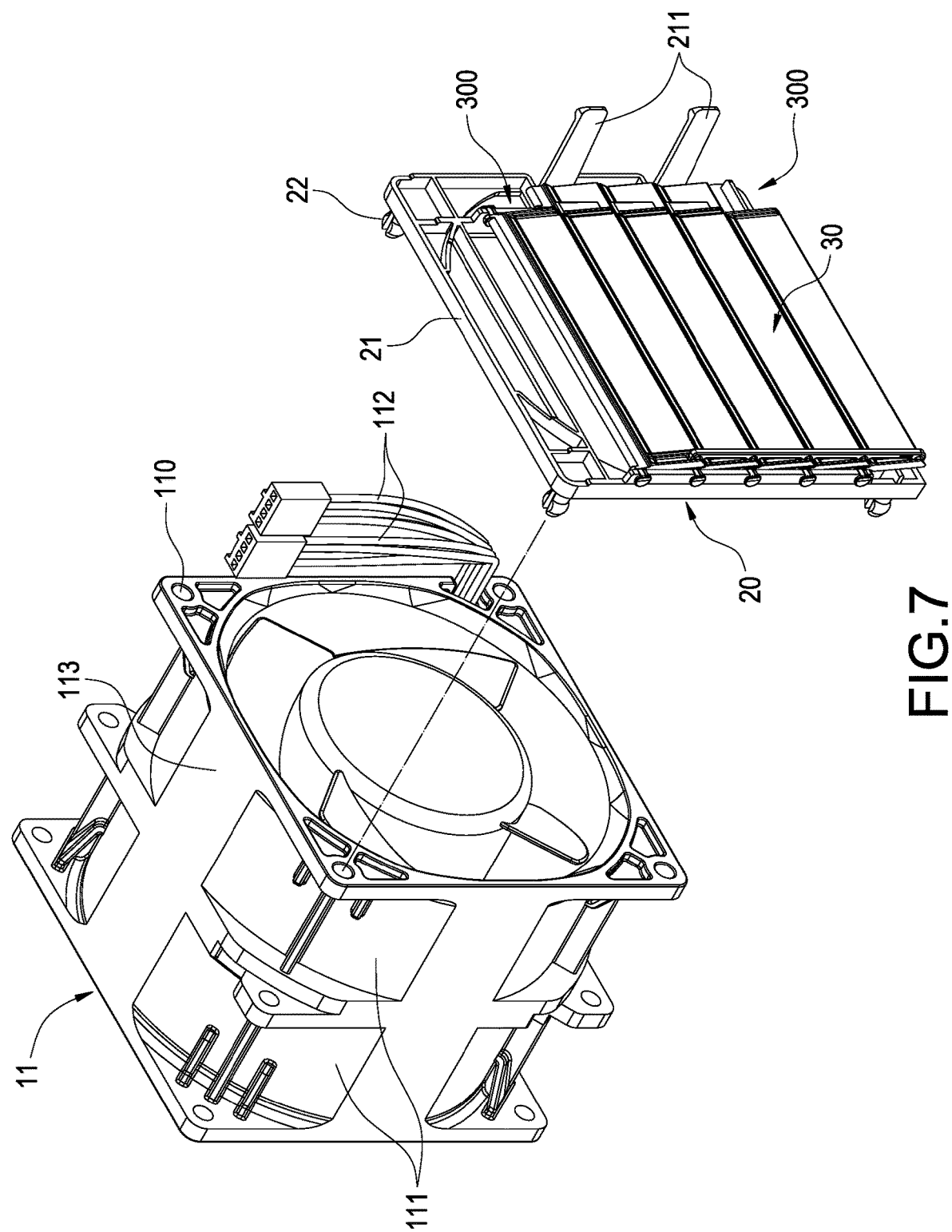
FIG. 7 is an explosion view of the fan module and position assembly of the present invention.
Figure 8:
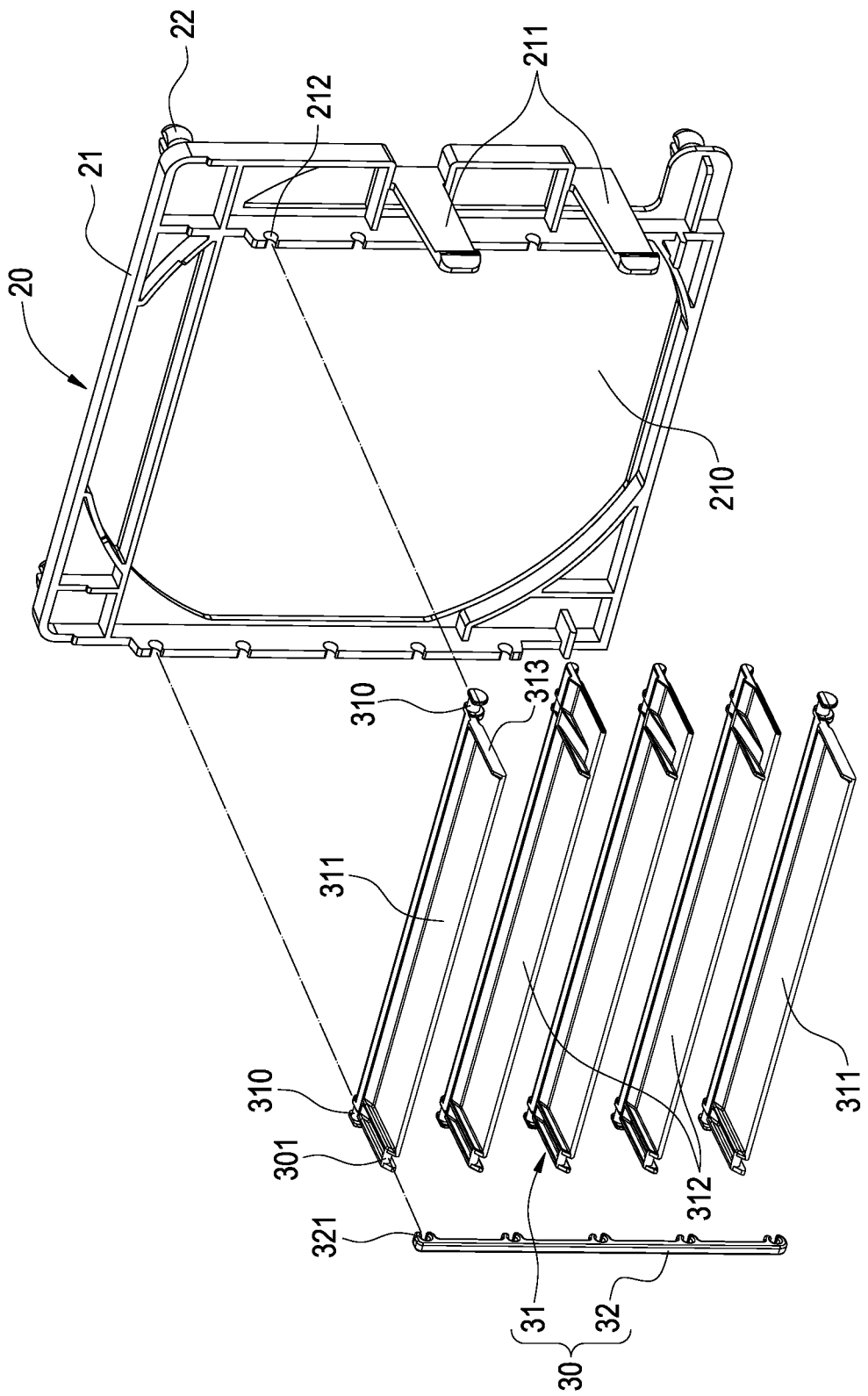
FIG. 8 is an explosion view of the position assembly and air shielding structure of the present invention.

Please further refer to FIG. 7 and FIG. 8, which depict an explosion view of the fan module and position assembly of the present invention and an explosion view of the position assembly and the air shielding structure of the present invention. The fan body 11 has a fan seat 113, and the fan seat 113 is provided with a plurality of coupling holes 110. In the present embodiment, the fan cables 112 of the fan body 11 pass out from one side of the fan seat 113 together.

The position assembly 20 includes a position frame 21 and a plurality of position members 22. The position frame 21 has an air outlet 210 corresponding to the outlet side 100 of the fan body 11 and is fixed on a side of the fan body 11 through the position members 22 inserting the coupling holes 110 of the fan seat 113. In the present embodiment, each of the position members 22 is a flexible post, and the position members 22 are disposed at the corners of the position frame 21.

Furthermore, one side of the position frame 21 is formed with at least one hook arm 211; besides, the two fan cables 112 of the fan body 11 are routed between the hook arm 211 and one of the metal plates 12 (refer to FIG. 5).

In the present embodiment, the position frame 21 has a plurality of hook arms 211 which are arranged at intervals and extend vertically at one side of the position frame 21.

Moreover, the airflow shielding structure 30 includes a plurality of shutter plates 31 and a connection rod 32 connected with the shielding plates 31. One side of the shutter plates 31 are pivoted at the position frame 21, and the shuttle plates 31 are capable of turning simultaneously for opening and closing the air outlet 210 through the connection rod 32. Preferably, each of the shutter plates 31 has a reinforcing rib 313 on one side thereof to increase the structural strength of each shielding plate 31.

Specifically, the position frame 21 has a plurality of axle holes 212; correspondingly, one side of each shutter plate 31 is provided with an axle portion 310, and axle portions 310 of the shutter plates 31 are coupled to the axle holes 212 of the position frame 21 correspondingly to cover the air outlet 210. Preferably, the axle holes 212 of the position frame 21 are arranged in pairs on opposite sides of the air outlet 210; correspondingly, one side of each of the shutter plates 31 is formed with a pair of axle portions 310 corresponding to the axle holes 212. Thereby, when one side of each of the shutter plates 31 is combined with the position frame 21, the other side of each shutter plate 31 hangs down due to its own weight, so that the position frame 21 is closed.

Additionally, each of the shutter plates 31 has a first clamp portion 301 separately, and the connection rod 32 has a plurality of second clamp portions 321 arranged at intervals. The connection rod 32 is connected to the shutter plates 31 together through the second clamp portions 321 engaging with the first clamp portions 301. In the present embodiment, the first clamp portion 301 is, but not limited to, a latch piece; the second clamp portion 321 is, but not limited to, a clamp slot.

In more detail, the shutter plates 31 include a first shutter plates 311 having a first length separately and a second shutter plates 312 having a second length separately. The first length corresponds to a size of the air outlet 210, and the second length is larger than the first length. Accordingly, the shutter plates 31 are combined with the position frame 21 so as to shield the air outlet 210.

Preferably, each of the shutter plates 31 has a reinforcing rib 313 on one side thereof to increase the structural strength of each shielding plate 31.

In the present embodiment, the shutter plates 31 include a plurality of first shutter plates 311 and a plurality of second shutter plates 312. In addition, the first shutter plates 311 are located at two sides of the second shutter plates 312 so that a reservation space 300 is formed at two sides of the position frame 21 separately. The disposition of the reservation space 300 is provided for routing the fan cables 112.

The server fan 1 of the present invention has an airflow shielding structure 30, thus the shutter plates 31 are shut on one side of the position frame 21 to close the air outlet 210. In addition, when the server fan 1 of the present invention is to be replaced, the airflow inside the server chassis 2 is blown toward the outside of server chassis 2 due to the positive pressure effect. Therefore, before the server fan 1 is placed in the server chassis 2 without running, the shutter plates 31 of the server fan 1 are shut to prevent the server fan 1 from reversing by the airflow inside the server chassis 2.

Figure 9:
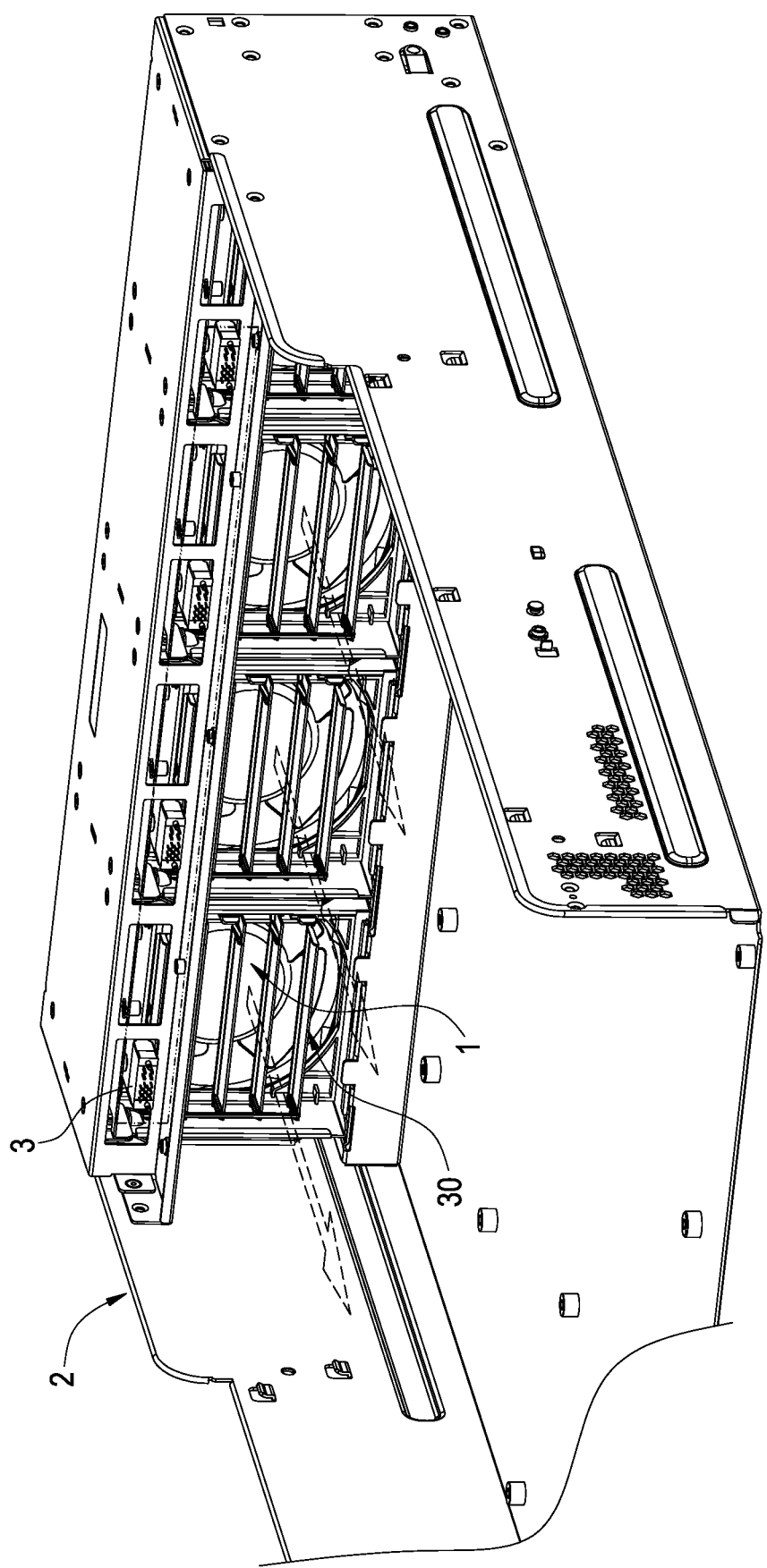
FIG. 9 is an operation schematic view of the server fan.

Please further refer to FIG. 9, which depicts an operation schematic view of the server fan. When the server fan 1 inserts the server chassis 2 and connects to the corresponding connector 3, the server fan 1 starts to run. The force airflow generated by the server fan 1 flows out from the air outlet 210. At that time, the shutter plates 31 are affected by the force air flow to turn over. In addition, since the shutter plates 31 are connected together by the connection rod 32, the shutter plates 31 are ensured to turn simultaneously so as to open the air outlet 210.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:
1. A server fan with airflow shielding structure for combining in a server chassis, comprising:
a fan module including a fan body and a plurality of metal plates, wherein the fan body has a fan seat, and the fan seat is provided with a plurality of coupling holes, and the metal plates enclose the fan body and expose an outlet side;

a position assembly including a position frame and a plurality of position members, wherein the position frame has an air outlet and is fixed on the outlet side through the position members inserting in the coupling holes; and an airflow shielding structure including a plurality of shutter plates and a connection rod connected to the shutter plates, wherein one side of the shutter plates are pivoted at the position frame, and the shuttle plates are capable of turning simultaneously for opening and closing the air outlet through the connection rod;

wherein the fan body includes two fans connected in series and two fan cables, and the two fan cables are connected to the two fans separately and pass out from one side of the fan seat together; and server fan further includes a circuit module, the circuit module is disposed on one of the metal plates and connected with the two fan cable.

2. The server fan with airflow shielding structure according to claim 1, wherein the metal plates include a rear plate located at an opposite side of the outlet side, and the rear plate is provided with a plurality of air holes configured in a honeycomb shape separately.

3. The server fan with airflow shielding structure according to claim 2, further including a pair of clamp pieces, wherein the pair of clamp pieces are coupled to two outer sides of the rear plate correspondingly.

4. The server fan with airflow shielding structure according to claim 1, wherein on one side of the position frame is formed with at least one hook arm, and the two fan cables are routed between the hook arm and one of the metal plates.

5. The server fan with airflow shielding structure according to claim 4, wherein the position frame has a plurality of hook arms, and the hook arms are arranged at intervals and extend vertically at one side of the position frame.

6. The server fan with airflow shielding structure according to claim 1, wherein the circuit module has a connection port, and the server chassis has a connector; and the connection port is inserted with the connector when the server fan inserts the server chassis.

7. The server fan with airflow shielding structure according to claim 1, wherein the position frame has a plurality of axle holes; each of the shutter plates is provided with an axle portion; and axle portions of the shutter plates are correspondingly coupled to the axle holes to cover the air outlet.

8. The server fan with airflow shielding structure according to claim 7, wherein the axle holes are arranged in pairs on opposite sides of the air outlet, and one side of each of the shutter plates is formed with a pair of axle portions corresponding to the axle holes.

9. The server fan with airflow shielding structure according to claim 1, wherein each of the position members is a flexible post, and the position members are disposed at corners of the position frame.

10. The server fan with airflow shielding structure according to claim 1, wherein the shutter plates include a first shutter plates having a first length separately and a second shutter plates having a second length separately; and the first length corresponds to a size of the air outlet, and the second length is larger than the first length.

11. The server fan with airflow shielding structure according to claim 10, wherein the shutter plates include a first shutter plates and a second shutter plates, and the first shutter plates are located at two sides of the second shutter plates to form a reservation space.

12. The server fan with airflow shielding structure according to claim 1, wherein each of the shutter plates has a reinforcing rib on one side thereof.

13. The server fan with airflow shielding structure according to claim 1, wherein each of the shutter plates has a first clamp portion; the connection rod has a plurality of second clamp portions arranged at intervals; and the connection rod is connected with the shutter plates through the second clamp portions engaging with the first clamp portions.

14. A server fan with airflow shielding structure for combining in a server chassis, comprising:

a fan module including a fan body and a plurality of metal plates, wherein the fan body has a fan seat, and the fan seat is provided with a plurality of coupling holes, and the metal plates enclose the fan body and expose an outlet side;

a position assembly including a position frame and a plurality of position members, wherein the position frame has an air outlet and is fixed on the outlet side through the position members inserting in the coupling holes; and an airflow shielding structure including a plurality of shutter plates and a connection rod connected to the shutter plates, wherein one side of the shutter plates are pivoted at the position frame, and the shuttle plates are capable of turning simultaneously for opening and closing the air outlet through the connection rod;

wherein the shutter plates include a first shutter plates having a first length separately and a second shutter plates having a second length separately; and the first length corresponds to a size of the air outlet, and the second length is larger than the first length.

15. The server fan with airflow shielding structure according to claim 14, wherein each of the shutter plates has a reinforcing rib on one side thereof.

16. The server fan with airflow shielding structure according to claim 14, wherein each of the shutter plates has a first clamp portion; the connection rod has a plurality of second clamp portions arranged at intervals; and the connection rod is connected with the shutter plates through the second clamp portions engaging with the first clamp portions.

\* \* \* \* \*